Jan. 29, 1963 H. DA COSTA ET AL 3,075,903

METHOD OF ELECTROLYTICALLY ETCHING A SEMICONDUCTOR ELEMENT

Filed Feb. 23, 1960

INVENTORS.
Harry da Costa
BY Carl H. Knowles
Mueller & Aichele
Att'ys.

United States Patent Office 3,075,903

Patented Jan. 29, 1963

3,075,903
METHOD OF ELECTROLYTICALLY ETCHING A SEMICONDUCTOR ELEMENT

Harry Da Costa, Phoenix, and Carl H. Knowles, Scottsdale, Ariz., assignors to Motorola, Inc., Chicago, Ill., a corporation of Illinois Filed Feb. 23, 1960, Ser. No. 10,395
2 Claims. (Cl. 204—143)

This invention relates generally to the etching of workpieces of miniature and microminiature size. In particular, the invention relates to a structure and a method for etching semiconductor bodies of the type provided in transistors so as to form on a surface of the semiconductor body an etched area, and an unetched area located centrally of the etched area which projects from the etched area.

Semiconductor units having this etched configuration are at the present time provided in high frequency transistors of the type known as "mesa" transistors. The semiconductor body for such transistors is provided with a substrate layer of one conductivity type and an adjacent diffused layer of opposite conductivity type, and the layers form a rectifying junction between them. The unetched central projection which is formed on the semiconductor body is a portion of the diffused layer and the rectifying junction, and it defines the active base and the active collector junction of the transistor. This projection is very tiny (it has about the same area as a human hair), and the small size increases the frequency response and the switching speed of the transistor. An emitter junction is located on the projection, and this is provided by a strip of metal which is vapor-deposited on the central region of the semiconductor body and alloyed with it prior to the etching operation. Ohmic contact to the base of the transistor is provided by another vapor-deposited metal strip located next to the emitter. The substrate layer of the semiconductor body serves as the collector region of the transistor.

In order to form the etched and unetched areas described above, it has previously been the practice to mask the central region of the semiconductor body by applying suitable resist material to it, such as wax. Semiconductor material is etched away from an exposed surface surrounding the masked central region by applying electrolyte to the semiconductor body and passing current through the body and the electrolyte. The resist material can be applied selectively to the central region leaving all of the surrounding area exposed, but a preferred way of defining the masked and unmasked areas has been to apply a uniform coating of resist material over one entire surface of the semiconductor body and then move a needle around the periphery of the central region such that the needle removes the resist material in its path of movement, thus exposing an outline of the desired central projection on the surface of the semiconductor body. Material was then etched away from the semiconductor body at this exposed outline by applying electrolyte to the body and passing current through the body and the electrolyte, and the etching forms an endless, channel-like depression called a moat surrounding an unetched projection called a mesa. The resist material was then removed and the surface of the semiconductor was cleaned carefully.

High frequency transistors provided with semiconductor units which have been etched as described above have been found to be highly satisfactory both from a technical standpoint and a commercial standpoint. However, there are certain disadvantages in the use of resist material on the surface of the semiconductor unit during its fabrication. One of the most important of these disadvantages is that the resist material can contaminate the surface of the semiconductor unit, and it is well known in the transistor art that such surface contaminants are injurious to the transistor. Surface contaminants may impair the performance of a transistor immediately after its fabrication, but it is more likely that they will have a delayed effect causing the transistor to have a shorter useful life than predicted. Even though the resist material has been removed and the surface of the semiconductor unit has been cleaned very carefully, there still may be some residue on the active surface which can in time cause the surface to deteriorate, thus impairing or destroying the effectiveness of the transistor.

Another disadvantage in the practice of masking with resist materials is the time it takes to apply and remove the resist material. Although this time may be reduced to a few man-minutes by efficient operating procedures, it is highly desirable to provide a faster way for etching the desired configuration in order to increase the output of the manufacturing facilities.

Accordingly, it is one object of the present invention to provide a device and method for selectively etching material away from a peripheral area surrounding a central region of a miniature semiconductor body such that contamination of the semiconductor body is minimized.

Another object of the invention is to provide a device and method for forming on a surface of a workpiece an unetched central region surrounded by an etched area, by selectively applying etchant only to the area surrounding the central region while protecting the central region from the etchant without applying resist material to it.

Another object of the invention is to provide a device and method for treating a semiconductor die having a diffused layer of one conductivity type and a substrate layer of opposite conductivity type with a rectifying junction therebetween so as to selectively etch an endless, channel-like depression through the diffused layer and the rectifying junction and form a projection including an active base region and an active collector junction of predetermined area, with the entire surface of the diffused layer being exposed at the time that etching fluid is applied to it, and no contaminating masses are applied to the semiconductor body.

A feature of the invention is the provision of a method for forming a central projection of predetermined configuration on a semiconductor body by applying a non-injurious gas to a central region of the semiconductor body and concurrently applying etchant to an area of the semiconductor body surrounding the central region, such that the gas protects the central region and the etchant removes material from the surrounding area while leaving the central region unetched, thereby forming the desired projection.

Another feature of the invention is the provision of a multiple nozzle device for use in etching a surface of a semiconductor body in order to form on the surface a projection surrounded by an etched area, with the device including an outer nozzle for applying a hollow stream of liquid electrolyte to a selected area on the surface of the semiconductor body, and an inner nozzle for applying pressurized gas to the center of the surface area contacted by the electrolyte, such that the gas masks a central region within the selected area and the electrolyte etches away material from the selected area surrounding the central region when current is passed through the body and the electrolyte.

A further feature of the invention is the provision of an etching head which includes an outer tubular structure and an inner tubular structure supported in coaxial relation, a passage for supplying gas under pressure through the inner tubular structure, and another passage for supplying etching liquid between the inner and outer tubular structures, all arranged such that the head delivers a composite jet in which the gas flows through the center of a stream of etching liquid.

The invention is illustrated in the accompanying drawings in which.

Figures 1, 2, 3, 4, 5, 6, 7, 8:
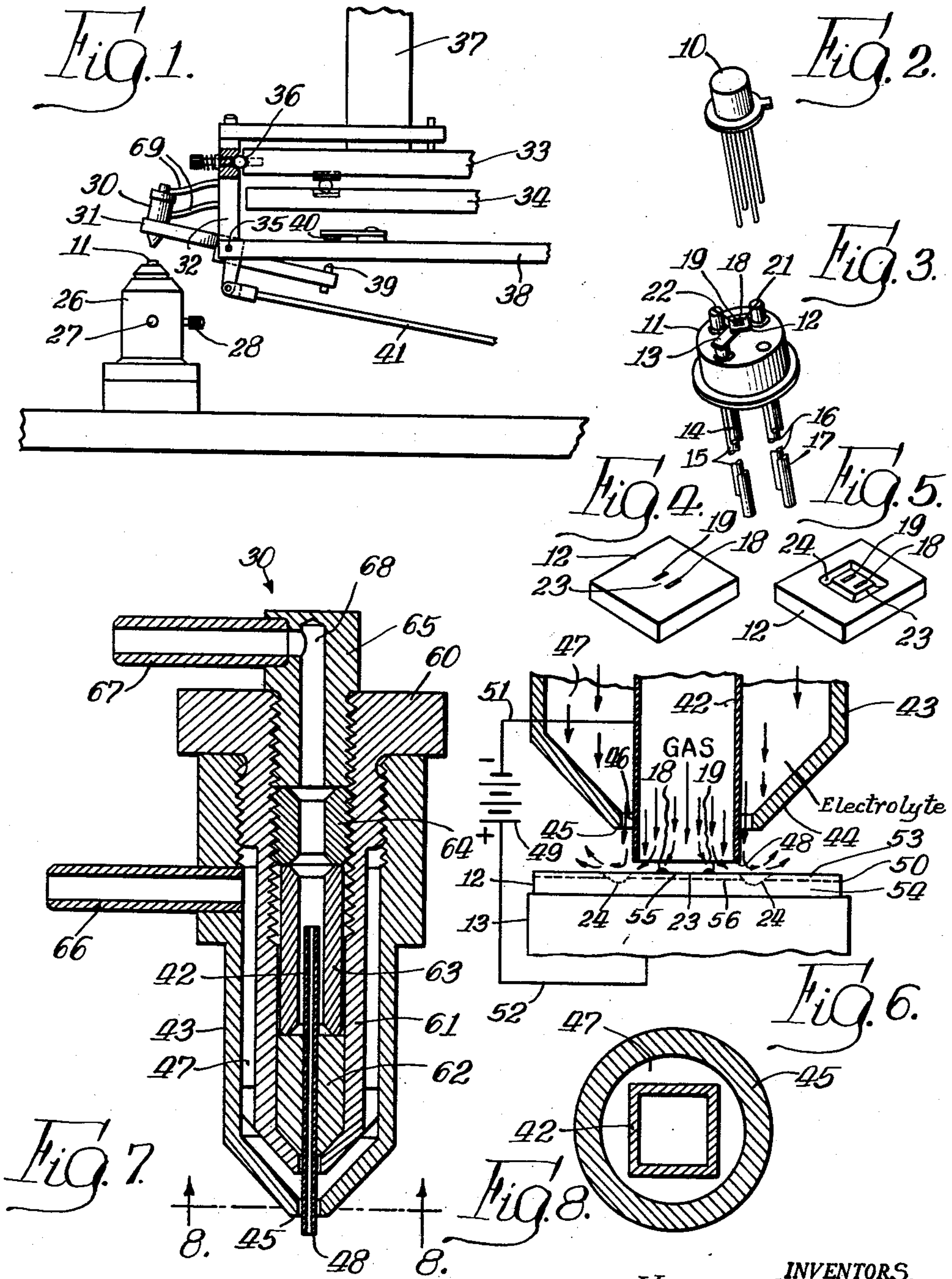
FIG. 1 is a view of part of an etching machine showing in particular an etching head in accordance with the invention positioned over a device on which a transistor assembly is mounted in position to be etched.
FIG. 2 is an enlarged perspective view of a complete high frequency transistor which is fabricated by a process in which the etching machine of FIG. 1 is employed.
FIG. 3 is a further enlarged view of the transistor of FIG. 2 with the cover removed in order to show the internal construction.
FIG. 4 shows a semiconductor unit included in the transistor assemblies of FIGS. 2 and 3, and this view illustrates the condition of the semiconductor unit just prior to the etching operation performed by the machine of FIG. 1.
FIG. 5 shows the condition of the semiconductor unit after it has been etched, and in particular this view shows the configuration of an unetched central projection surrounded by an etched area in the form of a continuous or endless channel-like depression.
FIG. 6 is a schematic sectional view of the end of the etching head of FIG. 1 showing in particular its relation to the semiconductor unit of FIGS. 4 and 5 at the time that gas and electrolyte are applied to the semiconductor unit to form the etched configuration of FIG. 5.
FIG. 7 is a longitudinal section of the etching head provided in the machine of FIG. 1, and shows the multiple-nozzle construction of the etching head.
FIG. 8 is a transverse cross-section of the end of the etching head viewed along line 8—8 of FIG. 7.

The method and device of the invention will be described in connection with the manufacture of high frequency transistors of the type illustrated in FIGS. 2 and 3, and the overall etching operation will be described first with reference to FIGS. 1 to 6. FIG. 2 shows a complete transistor device 10 and FIG. 3 shows a transistor assembly 11 which is complete except that the can or cover which encloses the unit is removed.

The workpiece which is etched in the machine of FIG. 1 is a tiny die 12 of semiconductor material such as germanium which, in the assembly of FIG. 3, is mounted on a heat sink tab 13 connected to the upper end of an electrical lead 14. The lead 14 is the collector lead of the transistor, and the other leads 15, 16 and 17 are respectively the base, emitter and ground leads of the transistor. An emitter junction is formed on the die 12 by a very small metal strip 18, and ohmic contact is made to the base of the transistor by another small metal strip 19 located next to the emitter strip 18. Two contact wires 21 and 22 extend respectively from the upper ends of the leads 16 and 15 to the metal strips 18 and 19.

The assembly which is supplied to the machine of FIG. 1 for etching has the semiconductor unit 12 mounted on the tab 13 as illustrated in FIG. 3, and before etching the assembly has the appearance of that shown in FIG. 3 except that the contact wires 21 and 22 have not yet been assembled and, of course, there is no etched depression surrounding the metal strips 18 and 19. The condition of the semiconductor unit 12 just prior to etching is illustrated in FIG. 4, and it can be seen in this view that the metal strips 18 and 19 are located on a central region 23 of one surface of the die unit 12. The different layers of the die unit 12 are shown schematically in FIG. 6. There is an N-type diffused layer 53 under the surface contacted by the strips 18 and 19 which provides the base region of the transistor, and the strip 18 includes P-type material which forms an emitter junction with this diffused layer. The other side of the die unit 12 has a P-type substrate layer 54 which forms a rectifying junction 50 with the diffused layer and provides a collector region.

The purpose of the etching operation performed on the unit 12 of FIG. 4 is to form an active base region and a collector junction which are smaller in area than the overall area of the die unit 12. This is accomplished by etching a moat-like depression 24 (see FIGS. 5 and 6) which extends around the emitter and base strips 18 and 19 and extends through the diffused layer 53 and the rectifying junction 50 into the substrate layer 54. The etching forms a central projection 23 which includes an active base region 55 and an active collector junction 56 which are actually portions of the diffused layer 53 and the rectifying junction 50, but which are electrically isolated from the remainder of the diffused layer and the junction. The projection 23 is sometimes called a mesa and the depression 24 is sometimes called a moat.

During the etching operation performed by the machine of FIG. 1, the assembly 11 including the die unit 12 (but not including the contact wires 21 and 22) is supported on a leveling device 26 which is positioned under the etching head 30. The assembly 11 fits into a recess in the top of the leveling device 26 and is held in place by a small clip (not shown). The leveling device 26 is adjusted by turning a pair of micrometer knobs 27 and 28 so that the upper surface of the die unit 12 will be parallel to the end of the etching head 30 when the head is lowered into position for etching as illustrated in FIG. 6. The leveling operation is done outside the etching machine, and the surface of the die unit 12 is viewed through a special optical system in order to determine when the surface of the die has been properly leveled. The optical system is not shown herein since this is not necessary for a full understanding of the present invention.

The etching head 30 is supported on a carrier arm 31 which is pivotally connected at 35 to a frame 32. The frame 32 is attached to a positioning plate 33 of a micromanipulator mechanism, and the plate 33 moves horizontally over a support plate 34. The frame 32 is pivoted about an axis represented by a spindle 36 and is also movable along this axis. The frame 32 is adjusted to establish a predetermined relation between the etching head 30 and a microscope (not shown) which is mounted on a post 37 secured to the positioning plate 33. The microscope is provided with a suitable target finder such as cross hairs, and the etching head is aligned with the microscope by means of the pivotal and axial adjustments of the frame 36 so that when the etching head is moved into position for etching, it will be aligned with an area of the semiconductor body 12 on which the cross hairs are sighted. Thus, in order to position the etching head 30 with respect to the die unit 12, the operator merely looks through the microscope and moves the plate 33 by means of a suitable control mechanism until the cross hairs of the microscope are aimed at the center of the die 12. The etching head 24 is then properly aligned with the surface to be etched.

The etching head is moved automatically from a raised position to a position closely spaced from the surface to be etched. The carrier arm 31 pivots around the spindle 35 and the pivotal movement of the carrier arm is controlled by an automatic positioning mechanism including the control arm 38 and electrical contactors 39 and 40. When the etching operation is complete, a rod 41 is actuated generally to the left as viewed in FIG. 1 in order to raise the etching head 30. The remainder of the automatic positioning mechanism is not shown herein because it is not believed to be pertinent to the present invention.

The manner in which the die unit 12 is etched will be described with reference to FIG. 6. The etching head 30 has an inner tubular structure 42 and an outer tubular structure 43 which are partially illustrated in FIG. 6. The outer tube 43 narrows down at one end 44 and has an opening extending through the portion 45. The inner tube 42 extends through the opening at the portion 45, and the portion 46 of the tube 42 is spaced radially from the portion 45 of the outer tube 43. Gas flows through the center of the tube 42, and liquid electrolyte flows through the space 47 between the inner and outer tubes. The electrolyte passes through the opening between the portions 45 and 46 of the tubes, and flows down onto the upper surface of the die unit 12. The gas flows outwardly from the end portion 48 of the inner tube 42 and forces the electrolyte outwardly as shown by the arrows in FIG. 6.

Current is passed through the semiconductor body and the electrolyte causing the electrolyte to etch the endless channel or moat-like depression 24 in the die unit as represented by the curved dotted lines in FIG. 6. The electrical potential which produces the current is supplied from a suitable source represented schematically by the battery 49, and this potential is applied to the etching head 30 and the die unit 12 by means of suitable electrical connections represented schematically by the leads 51 and 52. A satisfactory potential is about 100 to 200 volts. The etching head 30 receives negative potential and the die unit 12 receives positive potential, and this causes the material of the die unit that is contacted by the electrolyte to be etched away. The tubular structures 42 and 43, the electrolyte, the semiconductor unit 12 and the support 13 conduct the etching current. The distribution of current in the stream or jet of electrolyte is such that material is selectively etched away from the area 24 surrounding the central region 23 of the die unit 12. The gas which flows through the inner tube 42 is at a slightly higher pressure than the surrounding atmosphere, and this prevents the electrolyte from flowing in toward the central region 23 to any undesirable extent.

The etching action of the electrolyte and current is continued for a time sufficient to etch through the diffused layer 53 and the junction 50 and into the substrate layer 54. This time is about 3 to 5 seconds for the particular semiconductor units described herein. Then the unit 12 is cleaned by applying distilled water to it. As a result of the etching, the portion 55 of the diffused layer and the portion 56 of the junction included within the central region 23 are electrically isolated from the remainder of the diffused layer 53 and junction 50. The layer portion 55 is the active base region of the semiconductor unit and the junction portion 56 is the active collector junction of the unit, as mentioned previously.

The construction of a specific embodiment of the etching head of the invention is illustrated in FIGS. 7 and 8. The outer tubular structure 43 has a circular cross section, and the inner tubular structure 42 has a square cross section in the illustrated embodiment. The square shape of the inner tube 42 makes the depression 24 have a generally square shape, and this is desirable for the illustrated transistor. However, in applications where it is desirable to form a projection on a surface which has a different configuration, such as rectangular, circular, or oval, the cross sectional shape of the tubular structures may be modified accordingly. The tube 42 has about the same cross-sectional area as the area desired for the unetched central region or projection 23 to be formed on the die unit.

The tubular structures 42 and 43 are attached to a supporting structure including a member 61 having a flange 60 at the top. The member 61 has generally the same shape as the tubular structure 43, but is smaller in diameter so that an annular passage 47 is provided between the members 43 and 61. The inner tube 42 is supported by an insert 62 which fits at the bottom of the member 61, and a spacer ring 63 is positioned adjacent the member 62. A holding ring 64 is screwed down onto the spacer 63 by means of threads provided in the interior of the supporting tube 61, and a threaded cap 65 is also screwed into the support tube 61. An inlet pipe 66 extends through the wall of the outer tube 43 and opens into the passage 47, and another inlet pipe 67 extends into the cap 65 and opens into the passage 68 which extends through the cap 65 and the rings 64 and 63. As may be seen in FIG. 1, suitable hoses 69 are connected to the inlet pipes 66 and 67.

Gas from a suitable source is supplied under pressure to the inlet 67 and flows through the passage 68 and the inner tube 42 and outwardly around the edge 48 at the end of the inner tube. The electrolyte liquid is supplied from a container which has a pressure head of the order of 40 inches of the electrolyte solution, and the liquid flows by gravity in the inlet pipe 66, through the passage 47 and out the opening at the end portion 45.

Thus, the etching head 30 is a multiple nozzle device which provides a stream of gas surrounded by a stream of electrolyte. When current is passed through the electrolyte, it etches a moat-like depression into the workpiece, and the gas protects the region within the depression from the etching action.

It has been found that in order to etch the desired configuration in a die unit 12, the end 48 of the tube 42 should be closely spaced from the parallel to the surface of the die. A suitable spacing between the tube 48 and the die is about one ten-thousandth of an inch, and the parallel relation between the tube and the die is established by the leveling device 26 as described above.

The gas which flows through the tube 42 must be at a slightly higher pressure than the surrounding atmosphere in order to force the electrolyte outwardly away from the central region 23. A suitable gas pressure is about three pounds per square inch in excess of the ambient pressure. The gas should be non-injurious or inert toward the material of the semiconductor unit 12, and a suitable gas is nitrogen.

The etching electrolyte may be any of several materials commonly used for etching in the art such as an aqueous solution of nitric acid, but it has been found that much better results are obtained when an electrolyte consisting of a dilute solution of a chelating agent in distilled water is employed. The preferred chelating agent is a sodium salt of ethylenediaminetetracetic acid, and it is available commercially under the trademark "Versene." A suitable concentration for this electrolyte solution is about 2 drops of the chelating agent per liter of distilled water. The electrolyte including the chelating agent has the advantage that the material which is etched away from the semiconductor body does not plate onto the end of the etching head to any undesirable extent, even though direct current rather than alternating current is passed through the electrolyte. Thus, the nozzle openings stay clean from one operation to the next. Also, electrolyte of this material can easily be washed off of the semiconductor body with distilled water so that there is no residue which might contaminate the unit.

The etching device and method of the invention does not require the use of resist materials on the semiconductor units of the transistors described above, and thus a source of contamination of the semiconductor units is eliminated. Also, the etching operation can be carried out almost entirely automatically in less time than has been required when resist materials are employed. The multiple nozzle etching head is of a simple and inexpensive construction, and its use in the fabrication of high frequency transistors results in significant economies.

We claim:

1. A method of etching a semiconductor element having a contact on a surface thereof and a junction beneath said surface to form a mesa at said contact which includes a portion of said junction, said method including the steps of:

(*a*) establishing and maintaining said semiconductor element and an etching nozzle in stationary positions wherein a hollow tip of said nozzle extends about said contact and is closely spaced from and parallel to said surface of said semiconductor element, thereby forming a narrow gap for gas to escape radially outward from said nozzle at said surface, (*b*) passing a flowing stream of liquid electrolyte over the exterior of said nozzle tip on to an area of said semiconductor element surrounding said contact, (c) forcing said liquid stream radially outward from said contact at said semiconductor surface by supplying gas under pressure from the interior of said nozzle tip through the narrow gap between said nozzle tip and said semiconductor surface, (d) passing electric current between said liquid electrolyte and said semiconductor element to etch semiconductor material from said element forming a depression therein about said contact, with the gas flowing radially outward through said gap controlling the flow of electrolyte to prevent undercutting, (e) and terminating said etching when said depression reaches a predetermined depth greater than the depth of said junction in said semiconductor element from said surface, thus forming a mesa at said contact which includes a portion of said junction.

2. An etching method for use in the fabrication of semiconductor devices, comprising the steps of:

(a) providing a semiconductor element having a contact on a surface thereof and having a junction therein beneath said surface, (b) establishing and maintaining said semiconductor element and an etching nozzle in stationary positions wherein said surface of said semiconductor element faces upward and a hollow tip of said nozzle extends about said contact and is closely spaced from and parallel to said surface of said element, thereby forming a narrow gap for gas to escape radially outward from said nozzle at the semiconductor surface, (c) passing liquid electrolyte downward over the exterior of said nozzle tip on to a surface area of said semiconductor element surrounding and spaced laterally from said contact, (d) concurrently supplying gas under pressure from within said nozzle radially outwardly through the narrow gap between said nozzle tip and said semiconductor surface causing the liquid electrolyte to flow radially outward from said contact at said semiconductor surface, (e) applying a voltage between said liquid electrolyte and said semiconductor element causing said electrolyte to etch material from said semiconductor element around said contact and thereby form a depression in said semiconductor element around said contact, with the gas flowing radially outward through said gap controlling the flow of electrolyte to prevent undercutting, (f) and terminating said etching when said depression reaches a depth greater than said junction therein in order to form a projection on said semiconductor element which includes said contact and a portion of said junction.

References Cited in the file of this patent

UNITED STATES PATENTS

| | | |
|---|---|---|
| 2,523,018 | Henderson | Oct. 7, 1944 |
| 2,360,676 | Henderson | Oct. 17, 1944 |
| 2,382,233 | Kivley et al. | Aug. 14, 1945 |
| 2,523,199 | Diehm | Sept. 19, 1950 |
| 2,739,882 | Ellis | Mar. 27, 1956 |
| 2,744,000 | Seiler | May 1, 1956 |
| 2,841,477 | Hall | July 1, 1958 |
| 2,873,232 | Zimmerman | Feb. 10, 1959 |
| 2,895,814 | Clark | July 21, 1959 |
| 2,902,419 | Carasso | Sept. 1, 1959 |
| 2,913,383 | Topfer | Nov. 17, 1959 |
| 2,958,636 | Hershinger | Nov. 1, 1960 |

FOREIGN PATENTS

| | | |
|---|---|---|
| 583,764 | Canada | Sept. 22, 1959 |
| 335,003 | Great Britain | Sept. 18, 1930 |